United States Patent [19]
Müller et al.

[11] Patent Number: 5,123,016
[45] Date of Patent: Jun. 16, 1992

[54] ARRANGEMENT AND METHOD FOR IDENTIFYING AND LOCALIZING FAULTY CIRCUITS OF A MEMORY MODULE

[75] Inventors: Bruno Müller, Munich; Hartmut Ritter, Feldkirchen, both of Fed. Rep. of Germany

[73] Assignee: Siemens Aktiengesellschaft, Munich, Fed. Rep. of Germany

[21] Appl. No.: 459,709

[22] PCT Filed: Jul. 11, 1988

[86] PCT No.: PCT/DE88/00432
§ 371 Date: Feb. 1, 1990
§ 102(e) Date: Feb. 1, 1990

[87] PCT Pub. No.: WO89/02122
PCT Pub. Date: Mar. 9, 1989

[30] Foreign Application Priority Data
Aug. 26, 1987 [DE] Fed. Rep. of Germany ....... 3728521

[51] Int. Cl.⁵ .............................................. G06F 11/20
[52] U.S. Cl. .................................. 371/10.3; 371/21.1; 365/200
[58] Field of Search ............... 371/10.1, 10.2, 10.3, 371/11.1, 21.1, 21.2, 21.3, 21.6, 22.5, 15.1; 365/200, 201; 364/200, 900

[56] References Cited

U.S. PATENT DOCUMENTS

| | | | |
|---|---|---|---|
| 3,995,261 | 11/1976 | Goldberg | |
| 4,191,996 | 3/1980 | Chesley | 364/200 |
| 4,460,999 | 7/1984 | Schmidt | 371/21 |
| 4,627,053 | 12/1986 | Yamaki | 371/10.3 |
| 4,701,920 | 10/1987 | Resnick | 371/22.5 |
| 4,736,373 | 4/1988 | Schmidt | 371/10.3 |
| 4,745,582 | 5/1988 | Fukushi | 365/200 |
| 4,751,656 | 6/1988 | Conti | 371/10.3 X |
| 4,759,020 | 7/1988 | Amundson | 371/10.2 |
| 4,860,260 | 8/1989 | Saito | 371/10.3 X |
| 4,937,790 | 6/1990 | Sasaki | 371/21.1 X |
| 4,980,888 | 12/1990 | Bruce | 371/21.1 |

FOREIGN PATENT DOCUMENTS 0186459 7/1986 European Pat. Off.
0242854 10/1987 European Pat. Off.

OTHER PUBLICATIONS

Jaspanese Patent Abstract, vol. 4, No. 58 (E-163) [1203] Mar. 10, 1983 (11) 57-207347.

Primary Examiner—Robert W. Beausoliel
Attorney, Agent, or Firm—Hill, Van Santen, Steadman & Simpson

[57] ABSTRACT

The identification of a faulty memory cells of a memory module ensues with the assistance of a selt-test method for whose implementation a processor (TPZ) is co-integrated on the memory module. In test mode, the test processor generates test patterns for the memory cells of the memory under test, evaluates the result signals output by the memory cells as a result of the test patterns and stores the addresses of memory cells that were identified as being faulty. With the assistance of the addresses of the faulty memory cells, the test processor produces a repair plan on the basis whereof rows and clumns having faulty memory cells are replaced with the assistance of replacemnet rows and replacement columns.

13 Claims, 5 Drawing Sheets

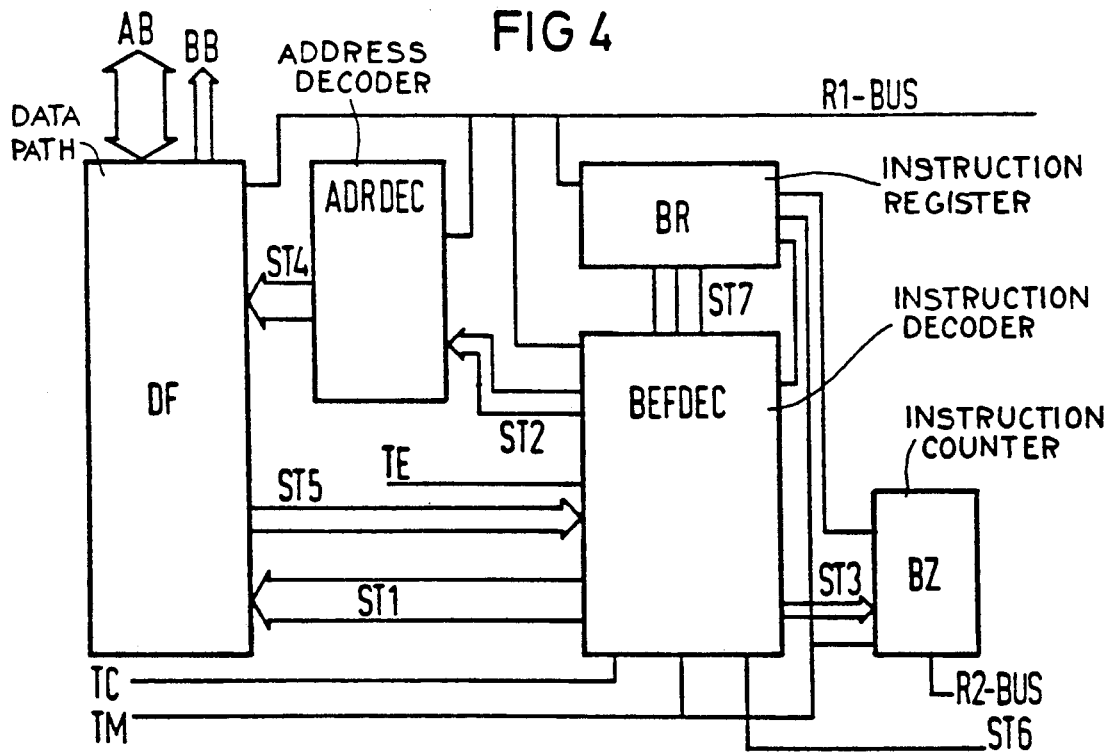

ARRANGEMENT AND METHOD FOR IDENTIFYING AND LOCALIZING FAULTY CIRCUITS OF A MEMORY MODULE

BACKGROUND OF THE INVENTION

Field of the Invention

The invention is directed to an arrangement and to a method for identifying and localizing faulty circuits of a memory module, particularly faulty memory cells, based on a self testing method.

Both as individual elements of a computer system as well as memory modules on LSI modules, memories assume an important role. Their development is advancing worldwide with wide spread application. Currently available memories have capacities up to a megabit. The trend is toward memory modules having an even higher capacity.

At present, memories are tested with the assistance of automatic test units. These can usually test only one module at a time. Whereas the manufacturing essentially dependent on the chip surface, the testing outlay increases with the number of elements to be tested per module. The share of testing costs in module costs is therefore increasing. The introduction of self-test methods allows one to expect an improvement in this situation. Some functions of the automatic test unit are thereby shifted into the module under test with additional circuits. It is not only static, but also some dynamic faults that can be recognized with what is referred to as on-chip testing. The self-test can sequence in parallel for all modules of a wafer or, respectively, for a plurality of modules. It is also possible to likewise utilize the self-test of the modules for a later assembly or, respectively, system test.

It is also known to repair faulty memory cells of a memory with the assistance of auxiliary rows of memory cells or auxiliary columns of memory cells. In order to be able to implement such a repair, the addresses of the faulty memory cells must be identified and retained. This ensues with the assistance of the automatic test unit that supplies the memory module with test patterns and that checks the resulting signals output by the memory module in response thereto. The evaluation of the resulting signals snows whether faulty memory cells are present. The addresses of faulty memory cells are then stored in the automatic test unit. A repair strategy is then prepared after the conclusion of the test, this indicating how the rows or columns having faulty memory cells must be replaced by replacement rows or, respectively, replacement columns. The selected replacement rows or replacement columns are activated by reprogramming and the rows or columns having faulty memory cells are disconnected. For example, fuses that can be activated with the assistance of laser light are employed for the reprogramming. Such methods are known, for example, from JST News, Vol. 3, No. 2, April 1984, Pages 18-26; IEEE Journal of Solid State Circuits, Vol. SC-18, No. 5, October 1983, pages 562-567; IEEE Journal of Solid State Circuits, Vol. SC-16, No. 5, October 1981, Pages 506-513; IEEE Design and Test, Vol. 6, Pages 35-44, 1985; Electronics, Jan. 12, 1984, Pages 175-179.

Memory self-test methods that are previously known do not support the above-recited repair possibilities. The self-test methods only supply a statement as to whether the memory module is faulty or is not faulty. In addition to a fault-free recognition, however, the self-test of reparable memory modules additionally requires that the faulty memory cells be localized and that a corresponding fault list be produced.

SUMMARY OF THE INVENTION

The object of the invention is comprised in specifying an arrangement and a method for identifying and localizing faulty circuits, particularly faulty memory cells, of a memory module, this working according to a self testing method of the memory module. A self-test of every memory module can be implemented With the assistance of this arrangement and the methods thereof and, moreover, a repair strategy can be produced on the basis of identified, faulty memory cells. The advantages of the self-test method in memory modules and the advantages of the repair possibility of high-capacity memory modules are thus achieved.

In an arrangement of the species initially cited, this object is achieved by a memory integrated on a memory module together with a test processor, the memory including replacement rows and/or replacement columns employable for repair. During the test mode, the test processor generates test patterns for the memory under test, evaluates the resulting signals output by the memory in response to the test patterns, and stores the address thereof given identification of faulty memory cells. The test processor produces a repair plan for faulty memory cells with the assistance of the stored addresses, the rows/columns having faulty memory cells being replaceable by replacement rows/replacement columns in accordance with the repair plan. Also in accordance with the repair plan, EPROM cells arranged in the drive circuit for the replacement row/replacement column are programmed so that the replacement row/replacement column replaces the row/column having faulty memory cells.

The object is also achieved with the method for identifying and localizing faulty memory cells of a memory comprising the following steps: (a) at the beginning of a test procedure, the memory arranged on a memory module together with a test processor is brought into its initial condition by the test processor; (b) in a test mode, the test processor generates test patterns for the memory under test, evaluates the resulting signals output by the memory in response to the test patterns, and stores the address thereof given the identification of faulty memory cells. (c) The test processor produces a repair plan for the faulty memory cells with the assistance of the stored addresses, rows/columns having faulty memory cells being replaceable by replacement rows/replacement columns in accordance with the repair plan. (d) The test processor makes a determination as to whether a repair is still possible, terminates the test given a negative result thereof and reports the module as being irreparable. Given a positive result of the determination, the test processor continues the test mode steps (b) through (d) until the entire memory has been tested. (e) After the conclusion of the test, the test processor determines whether faulty memory cells have been found. When no faulty memory cells are found, the module is reported as being fault-free; when, by contrast, faulty memory cells have been found, EPROM cells arranged in the drive circuit for the replacement row/replacement columns are programmed according to the repair plan so that the replacement row/replacement column replaces the row/column having faulty memory cells.

The test processor generates the test patterns for the memory module under test, evaluates the resulting patterns output by the memory as a consequence of the test patterns, and determines whether faulty memory cells are present in the memory. When this is the case, then the address of these faulty memory cells is stored. This can ensue in the register set of the test processor or in a fault-free region of the memory on the semiconductor module. Moreover, the test processor can produce a repair strategy for repairing the memory. The test processor can then output this repair strategy to an external programming means that then repairs the memory in a known way. However, it is advantageous when the test processor itself executes the repair. This is possible when the memory contains programmable cells that can be influenced with signals from the test processor. For example, this could be EPROM cells that are inserted in a known way into the selection circuits for the replacement rows or, respectively, replacement columns of memory cells and that are set by the test processor conforming to the repair strategy such that the selection circuits, for example, the decoder circuits, activate the replacement rows or, respectively, replacement columns instead of the rows or, respectively, columns having faulty memory cells.

The test processor thus assumes the tasks of an automatic test unit for the test of reparable memories and thereby proceeds according to the self-test method. The test processor is thereby executed such that the number of addresses of faulty memory cells to be stored is limited to a minimum set. This number can be derived from the available repair potential. It also serves as a criterion in order to be able to decide during a step-by-step test pattern evaluation whether the memory can still be repaired. This has the advantage that the test run can already be prematurely aborted if further testing would be meaningless.

Compared to a hard-wired executive sequencer, the test processor offers greater flexibility both during utilization as well as an adaptation to future memory organizations. This adaptation can ensue in a simple way with the assistance of a modification of the test programs. The analogous case applies given modified repair potential. The test word width, moreover, can be parameterized by the bit slice technique in the data path.

The test processor can thus support both the test in the entry check as well as the maintenance and startup checks in the system. It is also conceivable that the test processor supports the normal processor in the operating condition of the memory, for example, executes jobs that were hitherto externally controlled such as the refresh control in dynamic memories.

In order to provide a simple processor architecture, the instruction set can be limited to a few elementary functions. This leads to a low surface requirement on the semiconductor module and to a high processing performance. For example, such a test processor will have a surface requirement of approximately 5% on a dynamic megabit memory.

Further developments of the invention derive from the subclaims.

BRIEF DESCRIPTION OF THE RELATED ART

The invention shall be set forth in greater detail with reference to an exemplary embodiment that is shown in the FIGS. Shown are:

FIG. 1 a fundamental circuit diagram of the memory module with test processor;

FIG. 2 the architecture of the test processor;

FIG. 3 the instruction set;

FIG. 4 a box circuit diagram of the control and of the data path;

FIG. 5 a block circuit diagram of the instruction decoder;

FIG. 6 a flow chart that shows the self-test method;

FIG. 7 a flow chart that shows the method for storing the addresses of faulty memory cells.

DETAILED DESCRIPTION OF THE PREFERRED EMBODIMENTS

Figure 1:
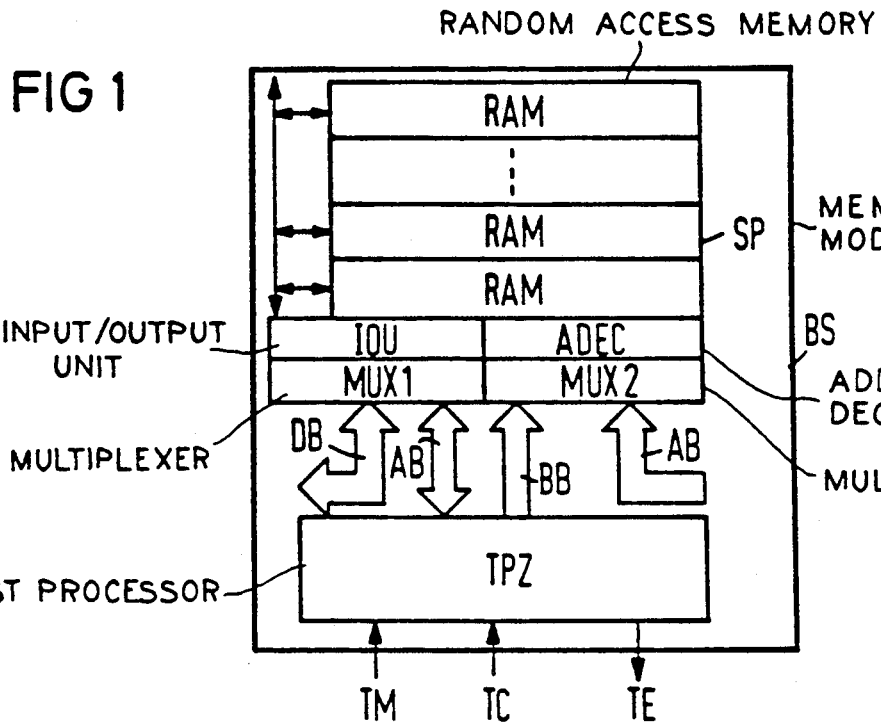

A fundamental circuit diagram of a memory module BS on which a RAM memory SP of various modules is integrated derives from FIG. 1. An address decoder ADEC and an input/output unit IOU are provided in a standard way for driving the memory SP. In addition to this known structure of the memory SP, a test processor TPZ is now co-integrated on the memory module BS. This test processor TPZ can be connected to the memory SP via multiplexers MUX1 and MUX2. To this end, a data bus A and an address bus B lead to the memory SP. The multiplexers MUX1 and MUX2 are required in order to be able to connect the address decoder ADEC or, respectively, input/output unit IOU to other units via a data bus DB and an address AB.

The memory SP can be constructed in a standard way, for example, it can be word-organized; however, it must be required that every memory cell of the memory is selectable. In the standard way, thus, such a memory SP can be composed of word lines and bit lines or of rows of memory cells and columns of memory cells.

The test processor TPZ is activated from the outside with a signal for test mode TM; a clock signal TC is also supplied to it from the outside. When the test processor TPZ has ended its activity, it reports this with a test end signal TE.

When a repair plan produced by the test processor TPZ is to be output to an external device, for example, a device that is intended to carry out the repair, the test processor TPZ outputs a corresponding address to this device, the repair plan being stored in the memory module SP under this address.

Figure 2:
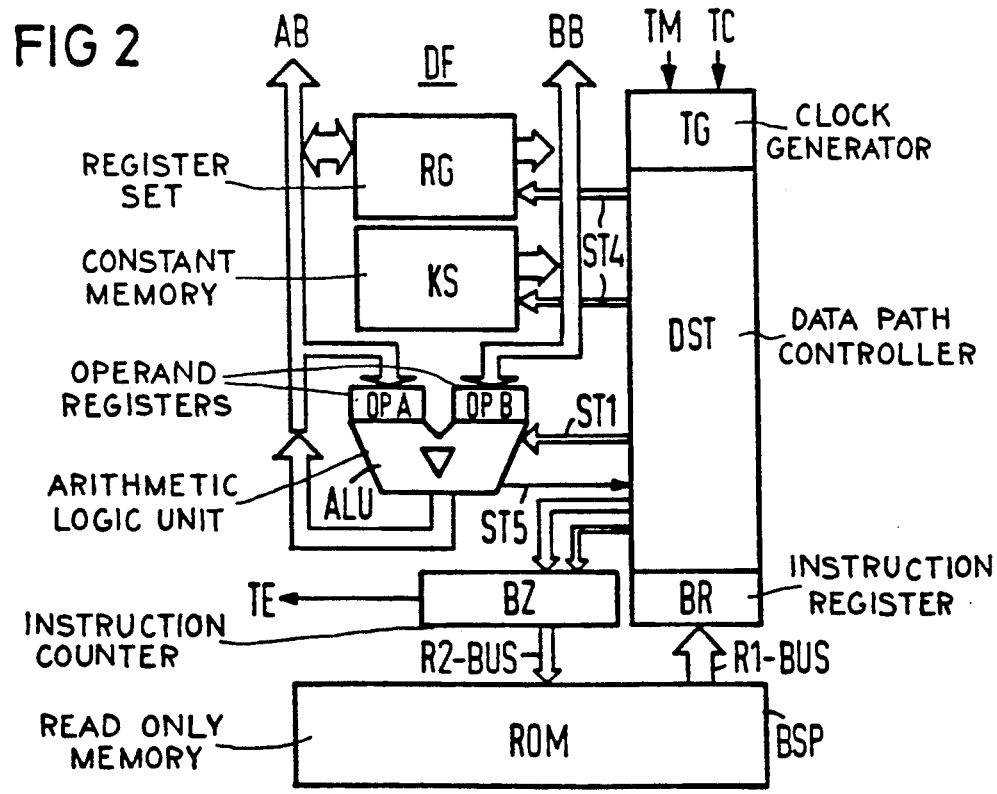

The architecture of the processor derives from FIG. 2. The test processor TPZ can be subdivided into three units, namely, a data path DF, a data path controller DST and a ROM memory BSP. The data path DF is composed of a register set RG, of a constant memory KS and of an arithmetic logic unit ALU. The arithmetic logic unit ALU also comprises an operand register OPA and an operand register OPB. The register set RG and the ALU are connected both to the data bus AB as well as to the address bus BB. The constant memory KS, by contrast, is only connected to the address bus BB.

For example, the addresses for the memory SP are formed in the register set RG; further, the information read out from the memory are stored in the register set RG. The test patterns for the memory SP can be taken from the constant memory KS.

The data path controller DST generates control signals for the register set RG, for the constant memory KS and for the arithmetic logic unit ALU from instruction words. To that end, instruction words of a test program are supplied to the data path controller DST from the memory BSP. The memory BSP, namely, contains the test programs that can be executed by the test processor TPZ. Every instruction word is first conducted to an instruction register BR, is then conducted from the latter to the data path controller DST where it is decoded and where the control signals ST allocated to the operation code of the instruction word are generated. A clock generator TG that generates the clock signals required for the operation of the data path controller DST is part of the data path controller DST. The clock signal TC is supplied to this clock generator TG from the outside.

An instruction counter BZ in which the address under which the next instruction word to be processed is stored in the memory BSP is formed is also required for the execution.

The instruction set of the test processor TPZ can be divided into four instruction types and, for example, can comprise eleven instructions overall. The four different types may be derived from FIG. 3. A first instruction type BF1 is directed to memory operations. Data can be written into a memory cell of the memory SP or, respectively data can be read instructions. The memory cell is thereby indirectly addressed, namely, via an address that resides in a register RGB of the register set. For reading the content of a memory cell, for example, the cell address is loaded from the register of the register set RG onto the BB bus and is applied to the addressing unit ADEC of the memory SP. The content of the addressed memory cell is loaded onto the A bus via the input/output unit IOU and is written from the A bus into a register RGA of the register set RG. This read event ensues via the load instruction. The writing of a memory cell ensues analogously with the store instruction.

The second instruction type BF2 initiates arithmetic operations in the ALU. The recited operations of subtraction, comparison, adding and moving are possible. A register-to-register transfer is executed with the move instruction. The content of the operand registers OPA and OPB is compared with the compare or CMP instruction. The add instruction ADD or, respectively, subtract instruction SUB is usually employed in order to increment or decrement the addresses of the memory cells in the register set RG.

A third instruction type BF3 is directed to Boolean operations with the assistance of the ALU. An NAND instruction is provided that is mainly employed in order to mask row or column addresses.

Finally, there is also a fourth instruction type BF4, the branch instructions BNF, BZF, BCF, BRA. The branch address ADR is thereby taken from the instruction word. Four branch conditions can be used:

a) a branch is to be carried out when no fault has been identified; a flag ZF is then set (instruction BNF);

b) a branch is to be made when a fault has been identified; a flag NZ is then set (instruction BNZ);

c) a branch is to be made when a carry has occurred; a flag CF is then set (instruction BCF);

d) a branch is always to be made; a flag RA is then set (instruction BRA).

The programs constructed of these instruction types reside in the instruction memory BSP as test programs. In the execution of a program, a respective instruction is loaded into the instruction register BR and the data path controller DST subsequently generates the control signals ST allocated to the operation code of the instruction word and supplies them to the data path DF. In accord with these control signals ST, the data path BF then initiates the operations corresponding to the operation code of the instruction word.

When reading a memory cell, for example, the address of this memory cell is loaded onto the BB bus in a first phase of the instruction execution and is then stored in the address decoder ADEC in a phase 2. The content of the addressed memory cell is transferred onto the A bus by the unit IOU and is stored in the register set RG. This ensues in phases 3 and 4. During the phase 2, the instruction counter BZ is incremented and the next instruction word is written into the instruction register BZ during phase 3. This execution applies both for the load instruction as well as for the store instruction.

For compare instructions CMP, the contents of the registers to be compared are loaded onto the AB bus and onto the BB bus in phase 1 of the instruction execution and are supplied from the latter to the ALU. In phase 2, the two register contents are subtracted from one another. When the contents of the registers are the same, then the flag ZF is set.

Given a branch instruction, the branch condition is checked in phase 3 and the absolute address is taken from the instruction word given an appropriate result and is loaded into the instruction counter BZ. When the branch condition is not fulfilled, the instruction counter BZ is incremented in a standard way. This occurs in phase 4.

The structure of the data path controller DST derives from FIG. 4. Further, the data path DF is shown as a block circuit diagram. The data path controller is composed of the instruction register BR, of the instruction counter BZ, of the address decoder ADRDEC and of the instruction decoder BEFDEC.

The instruction register BR simultaneously serves as output register of the instruction memory BSP and is therefore connected to the instruction memory BSP via the bus R1-BUS. The instruction register BR has two jobs to fulfill. At the beginning of the test procedure, it serves as signature register During later testing, it allows a pipelining of two instructions and is subsidivided into two parts R1, R5 (FIG. 5) for this reason. A pipelining of two instructions is executed only when the second instruction is a branch instruction. The second instruction, the branch instruction can then already be prepared during the execution of the first instruction. The result is that the test time can be shortened by, for example, ⅓ since approximately 2/7 of the instructions are branch instructions.

The instruction counter BZ serves as an input register of the instruction memory BSP. It is therefore connected to the instruction memory BSP via the bus R2-BUS. It can be a simple 9-bit counter that can also be loaded in parallel.

The address decoder ADRDEC decodes the register or constant addresses contained in the instruction word and addresses the registers of the register set RG or the memory cells of the constant memory KS via signals ST4.

Figure 5:
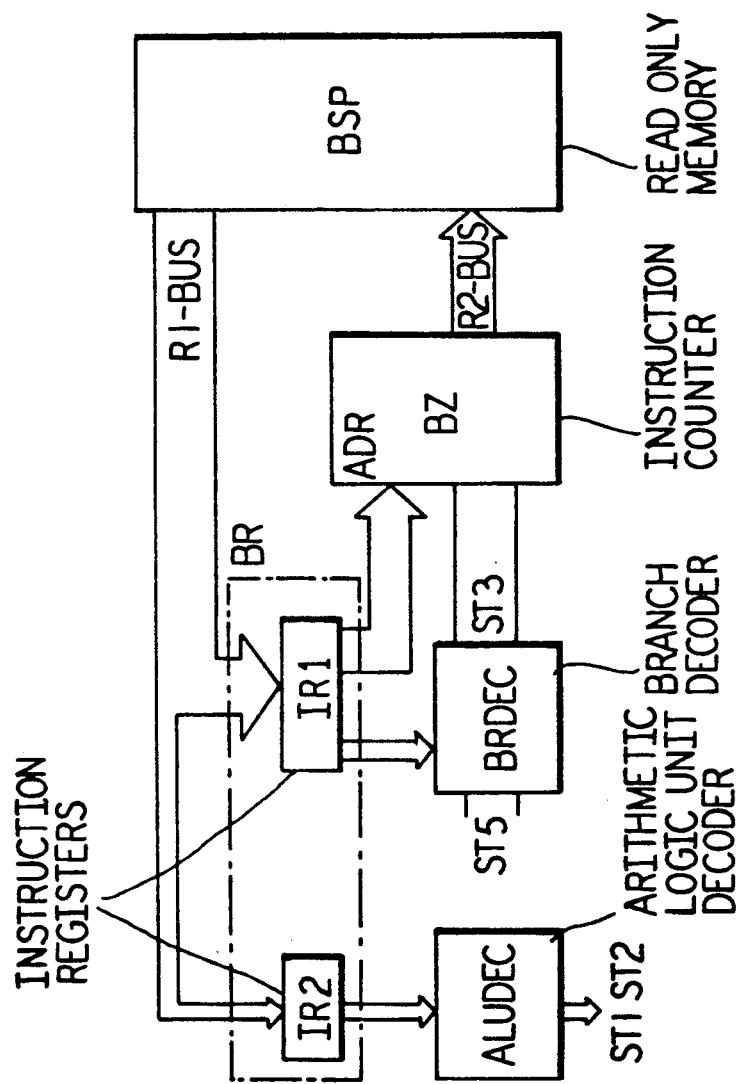

The exact structure of the instruction decoder derives from FIG. 5. It is composed of an ALU decoder ALUDEC, of a branch decoder BRDEC and of the clock generator TG (not shown).

The branch decoder BRDEC checks the operation code of the instruction word. When a branch instruction is involved and when the FLAG conditions (signals ST5 from the ALU) agree, then the instruction counter BZ is loaded with the new address (signals ST3). Otherwise, the instruction counter BZ is merely incremented (signals ST6).

The ALU decoder ALUDEC generates all control signals that are needed for the execution of all instructions (except branch instructions). One part of the control signals leads to the ALU (signal ST1); and one part leads to the address decoder ADRDEC (signals ST2).

The clock generator TG manages the chronological execution of the instruction steps. All other clock steps are thereby derived from the clock TC.

Since it is possible that the test processor TPZ also has faults on the basis whereof it would operate in faulty fashion so that a repair plan it generates would be incorrect, the test processor is subjected to a self-test before the memory is tested. This self-test can be divided into two executions. In a first execution, a small part of the test processor TPZ is tested by an additional circuit. The remaining part of the test processor TPZ is tested with the assistance of a special test program.

The instruction counter BZ is constantly integrated in the first execution of the test procedure. No branch instructions are carried out. The instruction register BR is interconnected to form a shift register (signals ST7); the entire program is then loaded into this shift register instruction word by instruction word and a signature is calculated. The signature is compared to a rated value at the end of this execution. When no error is identified, i.e. when the signature coincides with the rated value, then there is no fault in the instruction register BR in the program counter BZ and in the ROM BSP.

Subsequently, the program counter is loaded with the special test program in the second execution. Branch instructions can now also be executed. During this execution, the data path BF and the data path controller DST are tested, namely before the test of the memory is carried out.

Faults that are identified on the basis of this special test program or that are identified with the assistance of the signature end the test. When no faults are identified during these executions, then the test processor TPZ is considered fault-free.

Figure 6:
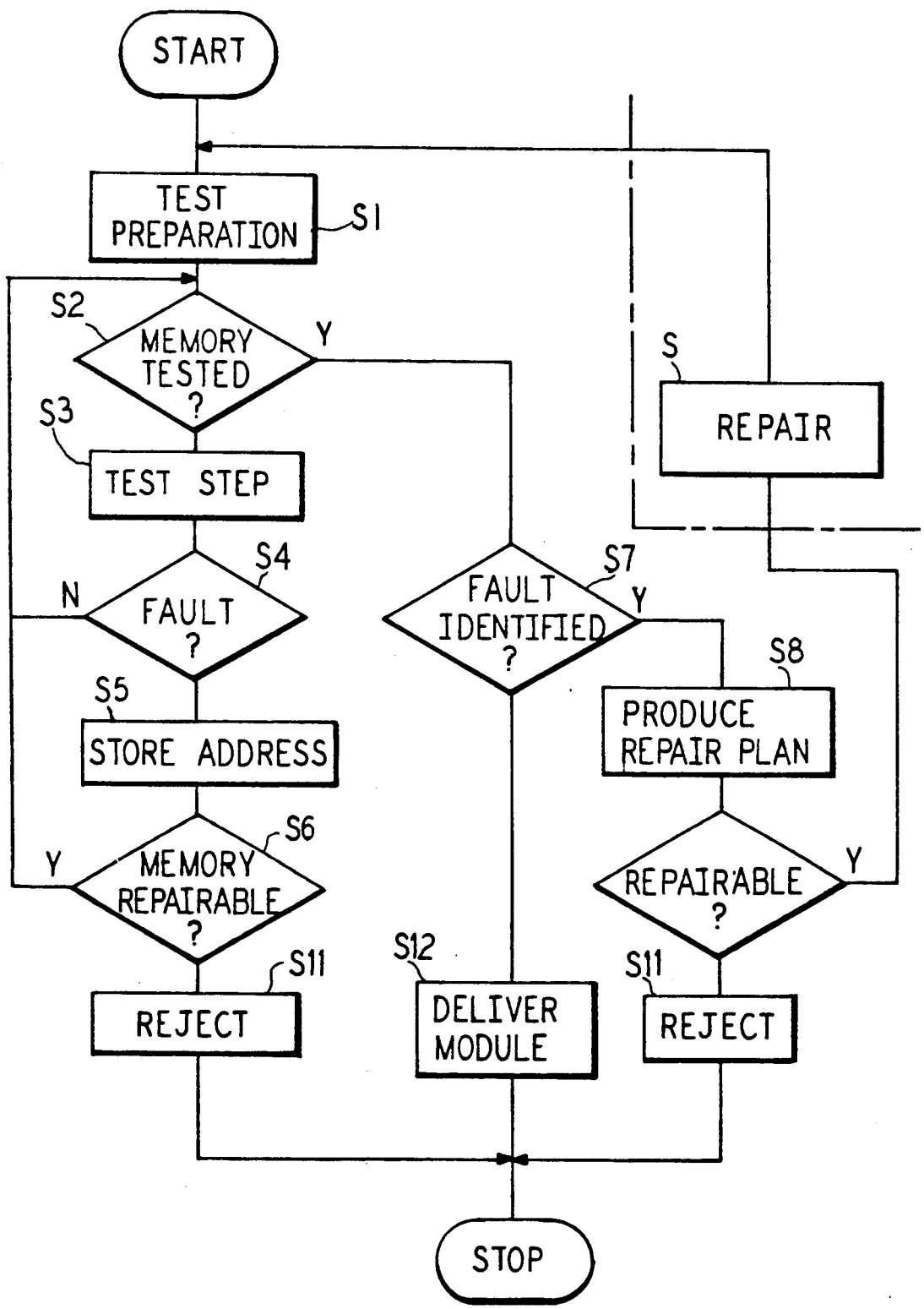

The function of the test processor shall be set forth with the assistance of FIG. 6 that shows a flow chart of the method for identifying faults in the memory SP. The method begins with the step of test preparation S1. The self-test of the test processor TPZ can be executed, for example, during this step S1. Further, the registers of the register set can, for example, be brought into their initial condition.

In the next step S2, a check is carried out to see whether all memory cells to be tested have already been checked. When this is not the case, a test step S3 is carried out, i.e. the memory cell to be tested is supplied with a test pattern and the result signal output by the memory cells in response thereto is evaluated.

An identification whether a fault is present is made in step S4. When this is not the case, then further work is continued with step S2. When, however, a fault is present, then a step S5 is executed wherein the address of the faulty memory cell is stored. The storing of these addresses can ensue in the register set of the test process. Given, high-capacity memories, this, however would lead to the register set becoming excessively large. In this case, it is more advantageous to store the addresses of the faulty cells in the memory SP. A fault-free region of the memory SP is then identified in the first step S1, namely, following the procedure that contains steps S2, S3, S4. The address of the fault-free memory region can then be stored in the register set RG.

After the address of the faulty memory cell has been stored, a check is carried out in step S6 to see whether a repair of the memory is possible at all. When this is the case, then work is continued with step S2. When this is not the case, then the memory module is irreparable and is treated as a reject (step S11).

When a determination has been made in step S2 that all memory cells have been tested, then a check is carried out in step S7 to see whether a fault was identified. When this is not the case, then the memory module is faultless and can be delivered (step 12).

When, however, a fault has been identified, then the test processor TPZ produces a repair plan in step S8. The production of the repair plan also shows whether the memory module can be repaired. The check ensues in step S9. When the memory module is irreparable, then it is a reject and cannot be employed (Step 11).

When, by contrast, it is reparable, then the memory module can be repaired according to the repair plan (Step 10), whereby the repair can ensue externally or internally with the test processor when the replacement rows or replacement columns are programmable by the test processor.

The step S3, the test step, can be executed with the assistance of known methods. One possibility, for example, is the marching-1/marching-0 method. According to this method, a 0 is successively written into every memory cell, the 0 is then read and, subsequently, a 1 is written in, the 1 is then read and a 0 is then written in again. This ensues with ascending addresses and with descending addresses.

Figure 7:
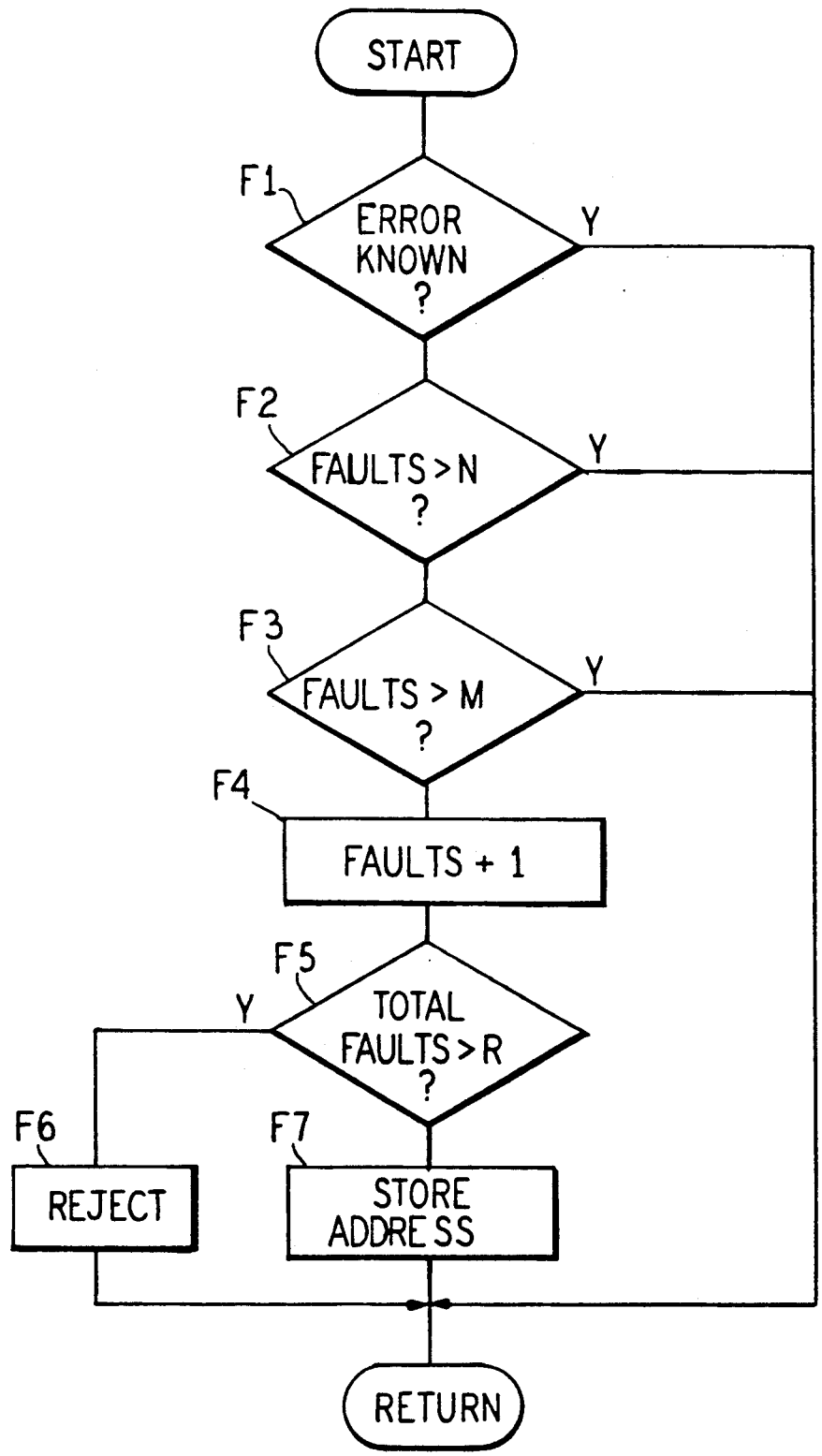

The fault registration, i.e. the step S5, can be executed according to the method of FIG. 7. A determination is made in step F1 whether the identified error of a memory cell is already known, i.e. whether the corresponding address has already been stored. When this is the case, then the fault identification method is over. When, however, this is not the case, then further work is carried out with step F2. A determination is made in step F2 to see whether the number of faults per row of memory cells is one greater than the number of replacement columns. n is the number of replacement columns. When this is the case, then it is no longer necessary to register this fault. As many faults as there are replacement columns have then already been identified in this row. When this case is present, then the fault identification is ended. When it is not present, then step F3 follows.

A corresponding identification for the faults per column is made in step F3. A check is carried out to see whether the faults per column are one greater than the number of replacement rows. m is the number of replacement rows. When this is the case, the fault is not registered; otherwise, the number of faults is incremented by 1 in step F4.

A check is carried out in step F5 to see whether the total number of faults that were identified in step F4 exceeds a defined limit. This limit is calculated according to the equation:

$$R = m(n+1) + n(m+1)$$

When the number of faulty memory cells identified exceeds this number R, then the memory SP cannot be repaired with the assistance of the existing replacement rows and replacement columns and is rejected in step F6. When, however, the number lies therebelow, then the address of the faulty memory cell is stored in step F7.

When, for example, two replacement columns and two replacement rows are provided, then the upper limit amounts to R = 12. A maximum of twelve faulty memory cells can thus be repaired with the assistance of the replacement columns and replacements rows.

This, however, does not mean that the memory is always reparable given a number of faults below R. A repair can nonetheless be impossible given an extremely unfavorable distribution of the faults.

The production of the repair plan, i.e. the execution of step S8 according to FIG. 6, can be executed according to a known method. For example, the repair-most algorithm can be employed for this purpose. This means that the rows and/or columns in which the most faults occur are repaired first. For example, the row having the most faults is repaired first, i.e. is replaced by the replacement row. Subsequently, the column having the most faults can be replaced by a replacement column. This procedure is continued as long as there are replacement rows and replacement columns available. When all faulty cells cannot be repaired in this fashion, then the memory module is a reject and cannot be further employed.

As derives from FIG. 6, the memory module can be tested again after the repair. This is possible without great outlay since the test processor TPZ is cointegrated on the memory module and can execute the test without further ado.

Although other modifications and changes may be suggested by those skilled in the art, it is the intention of the inventors to embody within the patent warranted hereon all changes and modifications as reasonably and properly come within the scope of their contribution to the art.

We claim:

1. An arrangement for identifying and localizing faulty memory cells of a memory under test, comprising:
   (a) a test processor integrated on a memory module together with the memory under test;
   (b) replacement rows and/or replacement columns of memory cells in the memory under test employable for repair of the memory under test;
   (c) the test processor including:
      means for generating test patterns for the memory under test during a test mode,
      means for evaluating resulting signals output by the memory under test in response to the test patterns to identify faulty memory cells, and
      means for storing an addresses of faulty memory cells identified by said means for evaluating;
   (d) the test processor including means for producing a repair plan for the faulty memory cells at the addresses stored by said means for storing, said repair plan designating rows and/or columns of the memory under test having the faulty memory cells to be replaced by the replacement rows and/or replacement columns;
   (e) a drive circuit for the replacement rows and/or replacement columns of memory cells including EPROM cells; and
   (f) means for programming said EPROM cells of said drive circuit so that the replacement rows and/or replacement columns replace the rows and/or columns having the faulty memory cells.

2. An arrangement according to claim 1, wherein the test processor further includes:
   (a) an instruction memory in which test programs are stored;
   (b) a data path having
      (b1) an arithmetic logic unit that is connected to a data and address bus leading to the memory under test;
      (b2) a register set connected to the data and address bus;
      (b3) a constant memory in which constants are stored and that is connected to the data and address bus;
   (c) and comprising a data path controller that generates control signals for said arithmetic logic unit, said register set and said constant memory of the data path dependent on instructions of the test programs supplied by the instruction memory.

3. An arrangement according to claim 2, wherein said data path controller includes,
   (a) an instruction register that is composed of two sub-registers in which a respective instruction word can be stored;
   (b) an address decoder that decodes the addresses contained in the instruction word for one of the register set and the constant memory;
   (c) a program counter that is a counter, can be loaded in parallel and that generates the addresses of the instruction words; and
   (d) an instruction decoder that generates control signals for said arithmetic unit, said register set and said constant memory of the data path from the instruction words.

4. An arrangement according to claim 3, further comprising:
   an instruction decoder including
   (a) an arithmetic logic unit decoder that generates control signals for the data path from an operation code of the instruction word;
   (b) a branch decoder that loads a branch address in the instruction counter corresponding to the operation code of an instruction word and to the status of interrogation bits;
   (c) a clock generator.

5. An arrangement according to claim 4, further comprising: means for storing addresses of the memory cells in the register set.

6. An arrangement according to claim 4, further comprising:
   means for storing test patterns in the constant memory.

7. An arrangement according to claim 1, wherein said test processor includes means for providing four instruction types, a first of said instruction types being for memory operations, a second of said instruction types being for arithmetic operations, a third of said instruction types being for Boolean operations, and a fourth of said instruction types being for branch operations.

8. An arrangement according to claim 1, wherein the test processor includes means for executing a self-test before testing the memory under test.

9. A method for identifying and localizing faulty memory cells of a memory to be tested, comprising the following steps:
   (a) at the beginning of a test procedure, bringing the memory to be tested arranged on a memory module with a test processor into an initial condition by said test processor;

(b) in a test mode, generating test patterns for the memory to be tested using the test processor, evaluating resulting signals output by the memory to be tested in response to the test patterns to identify faulty memory cells and storing addresses of the faulty memory cells identified in said evaluating step;

(c) the test processor producing a repair plan for the faulty memory cells using the addresses stored during said storing step, rows/columns having faulty memory cells being replaceable by replacement rows/replacement columns according to said repair plan;

(d) the test processor determining whether a repair is still possible; terminating the test given a negative result thereof and reporting the module as being irreparable given a negative result; given a positive result, continuing steps (b) through (d) until the entire memory has been tested;

(e) after the conclusion of the test, the test processor determining whether faulty memory cells have been found; when no faulty memory cells have been found during said test, reporting the module as being fault-free; when, by contrast, faulty memory cells have been found during said test, programming EPROM cells arranged in a drive circuit for the replacement rows/replacement columns according to the repair plan, so that the replacement row/replacement column replaces the row/column having the faulty memory cells.

10. A method according to claim 9, wherein the processor for registering a faulty memory cell executes the following steps:

(a) checking as to whether the identified address of a faulty memory cell has already been stored and ending the test procedure in this case; otherwise, continuing the test procedure with step (b);

(b) checking as to whether the number of faults per row is one higher than the number n of replacement columns and, in this case, ending the test procedure but, if the number of faults per row is not higher than the number n of replacement columns, continuing with step (c);

(c) checking as to whether the number of faults per column is one higher than the number m of replacement rows; and, in this case, ending the test procedure but, if the number of faults per row is not higher than the number m of replacement rows, continuing with step (d);

(d) determining whether the number of faults exceeds the maximally allowable number per module and, in this case, reporting the module to be faulty, but otherwise storing the address of the faulty cell.

11. A method according to claim 10, further comprising the step of:

achieving the maximum number of faults when the number of faults reaches the maximum value R where $R = m(n+1) + n(m+1)$, m = the number of replacement rows and n = the number of replacement columns.

12. A method according to claim 9, further comprising the steps of:

identifying a fault-free region of the memory at the beginning of a test procedure by the test processor and storing the addresses of the faulty memory cells in this region.

13. A method according to claim 9, further comprising the step of:

repairing first rows or columns wherein the most faults occur.

* * * * *